United States Patent [19]
Gold et al.

[11] Patent Number: 5,379,186
[45] Date of Patent: Jan. 3, 1995

[54] ENCAPSULATED ELECTRONIC COMPONENT HAVING A HEAT DIFFUSING LAYER

[75] Inventors: Glenn E. Gold, Coconut Creek; Anthony B. Suppelsa; Anthony J. Suppelsa, both of Coral Springs, all of Fla.

[73] Assignee: Motorola, Inc., Schaumburg, Ill.

[21] Appl. No.: 85,807

[22] Filed: Jul. 6, 1993

[51] Int. Cl.[6] ............................................. H05K 7/20
[52] U.S. Cl. .................................. 361/706; 174/52.2; 257/790
[58] Field of Search .................. 174/16.3, 52.2; 165/185; 257/705, 713, 717, 787, 790, 796; 361/386–389, 400

[56] References Cited

U.S. PATENT DOCUMENTS

| | | | |
|---|---|---|---|
| 4,768,081 | 8/1988 | Moeller | 257/790 |
| 4,843,520 | 6/1989 | Nakatani et al. | 361/386 |
| 4,970,579 | 11/1990 | Arldt et al. | 357/81 |
| 4,974,057 | 11/1990 | Tazima | 174/52.2 |
| 5,045,914 | 9/1991 | Casto et al. | 357/70 |

FOREIGN PATENT DOCUMENTS

| | | | |
|---|---|---|---|
| 0160145 | 8/1985 | Japan | 257/790 |
| 1067246 | 4/1986 | Japan | 257/790 |
| 1193472 | 8/1986 | Japan | 257/790 |
| 2155542 | 7/1987 | Japan | 257/790 |
| 1011354 | 1/1989 | Japan | 257/790 |

*Primary Examiner*—Gregory D. Thompson
*Attorney, Agent, or Firm*—Dale W. Dorinski

[57] ABSTRACT

An encapsulated electronic component having an integral heat diffuser. The heat producing electronic component (10) is mounted on a substrate carrier (12) and a layer of encapsulant material (16) covers the component. A layer of thermally conductive material (18) is applied over the encapsulant material, and then a second layer of encapsulant material (20) is applied over the thermally conductive material. The heat generated by the component is distributed throughout the thermally conductive material, thereby eliminating the hot spot over the component, resulting in a substantially lower surface temperature.

8 Claims, 2 Drawing Sheets

ENCAPSULATED ELECTRONIC COMPONENT HAVING A HEAT DIFFUSING LAYER

TECHNICAL FIELD

This invention relates in general to electronic components and more particularly to heat producing electronic components encapsulated with a heat diffusing layer.

BACKGROUND

It is well known that an important consideration in the production and use of integrated circuits (IC) is the package in which the IC resides. The modular casing in which the IC is packaged is an important factor in the ultimate cost, performance and lifetime of the product. Dissipation of the thermal energy generated by the IC is extremely important to the reliable operation of the package. Numerous schemes have been proposed and utilized in order to attempt to extract the heat from the package. Most of these strategies rely upon the use of a thermally conductive heat sink, either attached to the outside of the package or to the surface of the IC. Each of these approaches requires the use of additional parts and is cumbersome.

Much of the heat sink prior art shows the use of extruded aluminum or copper heat sinks of substantial mass. Other art, while using heat sinks of lesser mass, employ heat sinks having a very large surface area. The problem with attaching heat sinks to any IC package is the long thermal path between the source of the heat (IC) and the heat sink. This long thermal path impedes the efficiency with which heat can be extracted from the chip.

The power or heat generated by high-density ICs is now of the level that can make operation of the electronic device dangerous to the user in certain instances. For example, power amplifiers generate hot spots on the circuit board that can ignite surrounding materials and cause fire.

Clearly, the prior art heat dissipation methods have been insufficient in providing a low profile, low cost, and highly efficient package for integrated circuits that can dissipate the thermal energy generated by the ICs.

SUMMARY OF THE INVENTION

Briefly, according to the invention, there is provided an encapsulated electronic component having an integral heat diffuser. The heat producing electronic component is mounted on a substrate carrier and a layer of encapsulant material covers the component. A layer of thermally conductive material is applied over the encapsulant material, and then a second layer of encapsulant material is applied over the thermally conductive material. The heat generated by the component is distributed throughout the thermally conductive material, thereby eliminating the hot spot over the component, resulting in a substantially lower surface temperature.

Detailed Description of the Preferred Embodiment

Figure 1:
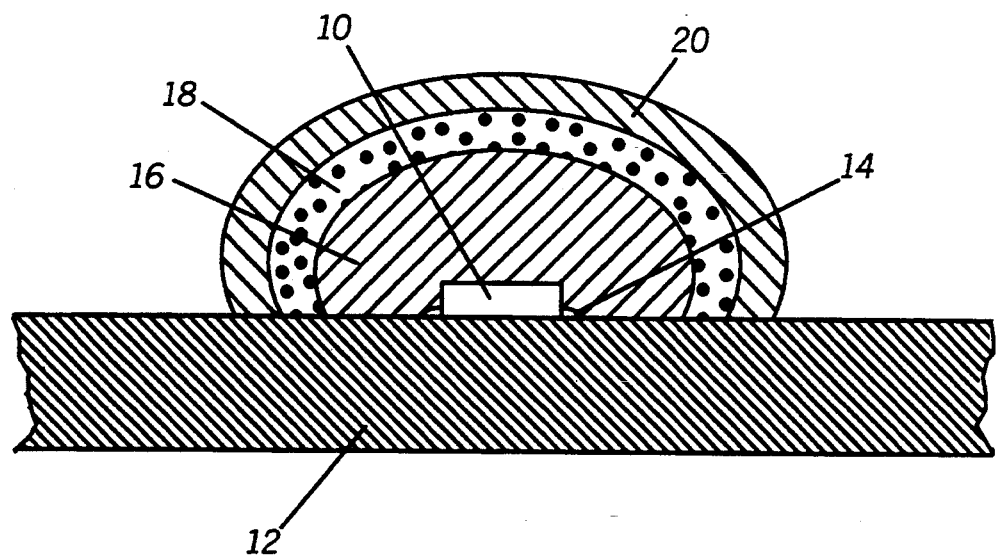
FIG. 1 is a cross-sectional view of an integrated circuit encapsulated in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a heat producing electronic component 10 is attached to a substrate 12. In the preferred embodiment of the invention, the substrate 12 is a printed circuit board, such as glass reinforced epoxy or polyimide, but may also be other materials, such as metal lead frames, flex circuits, ceramics, and so forth. Electrical connections 14 are made between the component 10 and conductive circuitry on the substrate 12. Electrical connections 14 may take the form of wires, solder joints, conductive epoxy, welds, wirebonds, TAB bonds, etc., and are well known in the art. The component 10 is encapsulated or covered by a first layer of encapsulant 16. Those skilled in the art will recognize that encapsulating means that the circuit component 10 is completely coated or covered so as to provide mechanical and environmental protection to the component. Typically, the encapsulant 16 is in direct and intimate contact with the surface of the component 10. The encapsulant material 16 is typically a polymeric material, such as epoxy, urethane, silicone, or acrylic. In each of these cases, the encapsulant layer 16 is a dielectric material and essentially a thermal insulator. That is to say, the encapsulant layer 16 is a relatively poor conductor of thermal energy.

A layer of thermally conductive material 18 lies directly over, and in intimate contact with, the first encapsulant layer 16. In the preferred embodiment of the invention, the thermally conductive layer 18 is a material such as aluminum nitride. Other thermal conductors such as beryllium oxide, aluminum, copper, silver, nickel, zinc, steel, and stainless steel, may also be used. The main requirement for the thermally conductive layer 18 is that it should have substantially greater thermal conductivity than the material used for the first encapsulant layer 16. The purpose of the thermally conductive layer 18 is to diffuse or dissipate the heat generated by the component 10. In the prior art, heat from the component 10 is contained with the immediate area of the component because the encapsulant is a poor thermal conductor. This generates hot spots directly above the component, causing localized heating. The thermally conductive layer 18 employed in the instant invention acts to diffuse or dissipate this heat over a much larger area, hot spots.

Typical materials used for encapsulating the component are materials such as silicone elastomers, silicone gels, epoxy encapsulants, acrylics, silicon-carbon resins, and urethanes. These include, for example, materials such as Dow Corning Q3-6635, HYSOL™ FP4402F epoxy, HERCULES™ Sycar resin and NPR100T from Japan-Rec Company.

A second layer of encapsulant 20 lies directly over, and in intimate contact with, the thermally conductive layer 18. The second layer of encapsulant 20 is typically the same material as the first layer of encapsulant 16, but depending upon the application, may be a different type of material. The purpose of this second layer of encapsulant 20 is to provide mechanical protection to the thermally conductive layer 18 and also to provide further mechanical integrity to the entire encapsulated package. The encapsulant layers 16 and 20 are then cured under the appropriate conditions for the selected materials.

Figure 2:
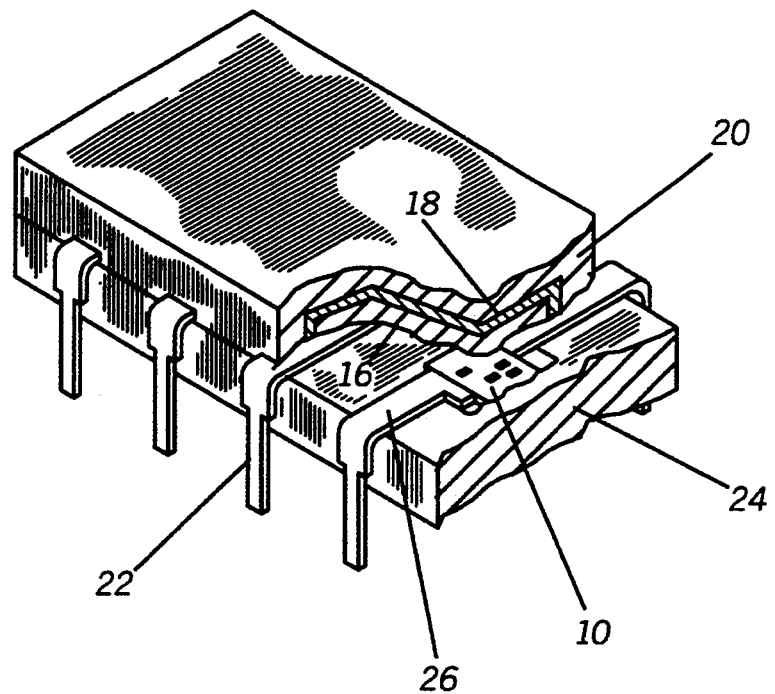
FIG. 2 is a cut-away isometric view of an alternate embodiment of the invention.

An alternate embodiment of the invention, shown in FIG. 2, utilizes a metal lead frame as the circuit carrying substrate. In this embodiment, the heat producing electronic component 10 is mounted on a die paddle portion 26 of a metal lead frame 22. The die paddle portion 26 is typically led out to a single lead or pin, and is electrically and thermally isolated from the remaining leads. A first layer of encapsulant material 16 is formed over the component 10 and a layer 18 of material that is a good thermal conductor and an electrical insulator, such as aluminum nitride, is then formed on top of layer 16. The second layer of encapsulant 20 is subsequently formed over the thermally conductive layer along with a bottom layer of encapsulant 24 lying underneath the component. The advantages accrued from this type of construction are that the heat produced by the electronic component 10 can be dissipated through the bottom of the component by means of the die paddle portion 26, into one pin of the lead frame 22, and also through the thermally conductive layer 18 to the other pins or leads, so as to dissipate the heat throughout the entire metal lead frame 22. In this way, much more heat can be dissipated than by simply relying on conduction through the die paddle.

EXAMPLE 1

(Control)

Figure 3:
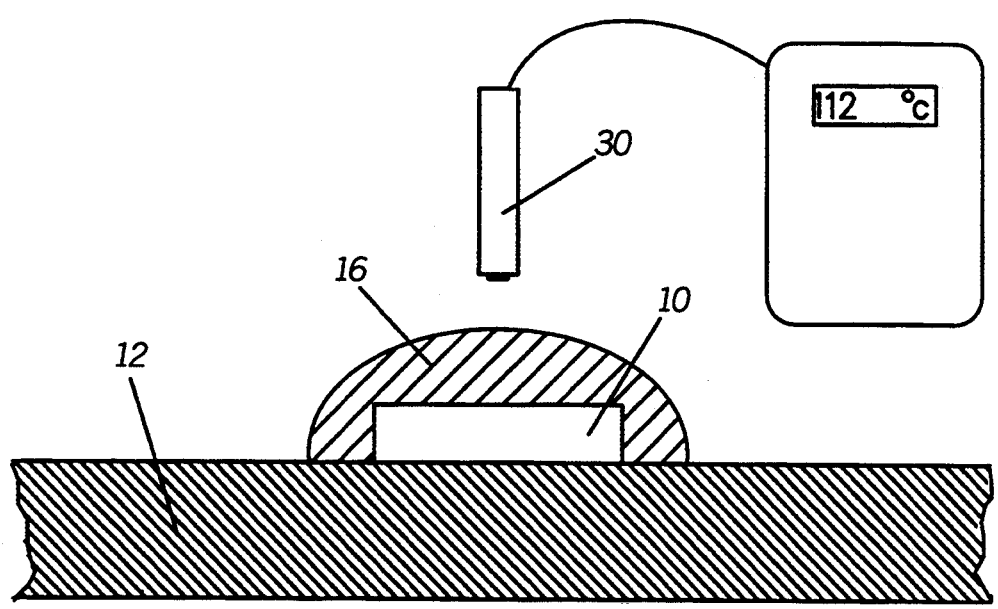
FIG. 3 is a cross-sectional view of an encapsulated electronic component.

A surface mountable leadless chip resistor, having a value of approximately 24 Ohms, was soldered to a glass-reinforced epoxy printed circuit board. The resistor was encapsulated, using NPR100T liquid epoxy encapsulant from Japan-REC. It was then cured for one hour at 100° C. and a subsequent post-cure for three hours at 150° C. Upon return to room temperature, a bias of five volts was applied to the resistor and the temperature of the surface of the encapsulant was measured with an infra-red thermometer 30 as shown in FIG. 3. The measured surface temperature of the component was 112° C.

EXAMPLE 2

A 24 Ohm surface-mountable leadless chip resistor was soldered to a printed circuit board as described in Example 1. A first layer of liquid epoxy encapsulant (NPR100T from Japan-REC) was applied over the resistor in accordance with the invention. A thermally conductive layer of aluminum nitride was formed over the epoxy. The thermally conductive layer consisted of aluminum nitride powder having a particle size between 85 and 100 microns. The thickness of the thermally conductive layer was approximately 10 mils. A second layer of NPR100T epoxy was formed directly over the thermally conductive aluminum nitride layer and the entire assembly was cured under the same conditions as employed in Example 1. After biasing the resistor at 5 volts, the surface temperature was measured with an infra-red probe and found to be 81° C.

As can be seen from the Examples, the incorporation of a thermally conductive layer of, for example, aluminum nitride, significantly reduces the surface temperature of the encapsulated component. In the two examples shown, the surface temperature was reduced by approximately 31° C. or 28%, thereby demonstrating the efficacy of the instant invention. Accordingly, it should be clear that the inclusion of a thermally conductive diffusing layer in the encapsulation serves to significantly reduce the surface temperature of a heat producing electronic component.

In further embodiment of the invention, more than one electronic component can be encapsulated on the board. For example, an entire printed circuit board assembly can be encapsulated or potted with the thermally conductive layer, providing an entire circuit assembly that has enhanced heat dissipation. The thermal conductive layer 18 can then be thermally connected to a heat sink or chassis to more effectively remove the heat. In another embodiment of the invention, the electronic component can be an energy storage device, such as a battery cell. Encapsulating one or more battery cells along with the associated electronics provides for a reliable, monolithic package that allows multi-cell battery packs to be rapidly charged without thermally damaging the cells.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An encapsulated electronic component having an integral heat diffuser, comprising:
    a substrate carrier;
    a heat producing electronic component mounted to the substrate;
    a first layer of encapsulant covering the electronic component; and
    a layer of aluminum nitride or beryllium oxide disposed directly on the encapsulant, said layer having greater thermal conductivity than the first layer of encapsulant.

2. An encapsulated electronic component having an integral heat diffuser, comprising:
    a printed circuit board;
    a heat producing electronic component mounted to the printed circuit board:
    a first layer of dielectric material encapsulating the electronic component, the dielectric material being a poor thermal conductor; and
    a heat diffusing layer of aluminum nitride disposed directly on the dielectric material, the heat diffusing layer having substantially greater thermal conductivity than the encapsulant layer.

3. The encapsulated electronic component as described in claim 2, further comprising a second layer of dielectric material disposed directly on the heat diffusing layer.

4. The encapsulated electronic component as described in claim 2, wherein the first layer of dielectric material comprises a material selected from the group consisting of silicone elastomers, silicone gels, epoxy encapsulants, acrylics, silicon-carbon resins, and urethanes.

5. The encapsulated electronic component as described in claim 3, wherein the second layer of dielectric material comprises a material selected from the group consisting of silicone elastomers, silicone gels, epoxy encapsulants, acrylics, silicon-carbon resins, and urethanes.

6. The encapsulated electronic component as described in claim 2, wherein the heat producing electronic component comprises a battery cell.

7. The encapsulated electronic component as described in claim 3, further comprising a plurality of electronic components mounted to the printed circuit board, and the dielectric material, the heat diffusing layer, and the second layer of dielectric material covers all of the electronic components.

8. An encapsulated electronic assembly having an integral heat diffuser, comprising:
  a printed circuit board;
  a plurality of heat producing electronic components mounted to the printed circuit board;
  a first layer of dielectric material encapsulating the plurality of electronic components and portions of the printed circuit board, the dielectric material selected from the group consisting of silicone elastomers, silicone gels, epoxy encapsulants, acrylics, silicon-carbon resins, and urethanes, and the dielectric material being a poor thermal conductor;
  a heat diffusing layer of aluminum nitride power or beryllium oxide power disposed directly on the dielectric material, the heat diffusing layer having substantially greater thermal conductivity than the encapsulant layer and having the property of being electrically non-conductive; and
  a second layer of dielectric material disposed directly on the heat diffusing layer, the second layer of dielectric material selected from the group consisting of silicone elastomers, silicone gels, epoxy encapsulants, acrylics, silicon-carbon resins, and urethanes.

* * * * *